United States Patent [19]

Dixon, Jr.

[11] 4,344,047
[45] Aug. 10, 1982

[54] MILLIMETER-WAVE POWER LIMITER

[75] Inventor: Samuel Dixon, Jr., Neptune, N.J.

[73] Assignee: The United States of America as represented by the Secretary of the Army, Washington, D.C.

[21] Appl. No.: 233,751

[22] Filed: Feb. 12, 1981

[51] Int. Cl.³ .......................... H01P 1/15; H01P 3/16; H01L 27/06

[52] U.S. Cl. ................................. 333/17 L; 333/164; 333/258; 333/247; 357/51

[58] Field of Search ............... 333/248, 258, 236, 238, 333/239, 240, 246, 262, 17 R, 17 L, 164, 103, 247; 307/303; 357/1-3, 13, 40, 51

[56] References Cited

U.S. PATENT DOCUMENTS

| 3,226,661 | 12/1965 | Garver et al. | 333/171 X |
| 3,750,055 | 7/1973 | Funck | 357/51 X |
| 4,200,880 | 4/1980 | Frey | 357/51 |
| 4,292,643 | 9/1981 | Kellner et al. | 333/247 X |

Primary Examiner—Marvin L. Nussbaum

Attorney, Agent, or Firm—Nathan Edelberg; Jeremiah G. Murray; Roy E. Gordon

[57] ABSTRACT

Disclosed is a millimeter wave bulk effect RF power limiter consisting of a planar PIN diode formed on a gallium arsenide (GaAs) substrate which also comprises the waveguide structure for RF energy in the 60-300 GHz range. The PIN diode is comprised of a wedge of intrinsic type semiconductor material formed across the top surface of the substrate and having mutually opposing regions of p and n type semiconductor material fabricated in the side edges of the wedge to which is attached planar beam leads. With suitable electrical operating potentials applied to the PIN diode avalanche breakdown occurs at a critical RF power level which acts to limit the flow of RF energy flow in the structure past the location of the PIN diode. Such a structure permits the device to be integrated into the front end sections of receivers utilized in communications, missile guidance and radar systems operable in the millimeter and sub-millimeter frequency range.

13 Claims, 5 Drawing Figures

MILLIMETER-WAVE POWER LIMITER

The invention described herein may be manufactured and used by or for the Government for governmental purposes without the payment of any royalties thereon or therefor.

BACKGROUND OF THE INVENTION

This invention relates generally to semiconductor power control devices and more particularly to a semiconductor switch device adapted to control the flow of RF power propagating along a waveguide structure.

When operating an image line transmitter and receiver in a high power signal environment, there is the attendant problem of protecting the mixer stage of the front end section of the receiver from other high average power emitters in close proximity. Most conventional power limiting devices operating, for example, in the microwave range are fabricated around a nonlinear element, generally a ferrite or diode in a coaxial or waveguide structure. Such devices are well known to those skilled in the art. In the approach to millimeter wave and submillimeter wave components; however, it has become apparent that the techniques used in the microwave region are inapplicable.

It is an object of the present invention, therefore, to provide a power limiter for millimeter waves.

It is another object of the present invention to provide a semiconductor millimeter wave power limiter.

Yet another object of the present invention is to provide a bulk effect millimeter wave power limiter adapted to protect RF receiver apparatus.

Still another object of the present invention is to provide a RF power limiter in the form of planar PIN beam lead diode formed on a dielectric image transmission line.

SUMMARY

Briefly, these and other objects are provided in accordance with a dielectric image transmission line for millimeter waves consisting of a gallium arsenide waveguide structure which additionally acts as a substrate on which is formed a bulk effect beam lead PIN diode consisting of relatively thick epitaxial layers of heavily doped n and p regions of semiconductor material separated by an intrinsic region generally in the form of a wedge lying transversely relative to the longitudinal direction of the gallium arsenide image line. The doped regions of n and p semiconductor material are formed as opposing recessed regions in adjoining side edges of the wedge or intrinsic material. On the application of a predetermined bias and signal potential across the diode an avalanche effect will occur at a predetermined power level which operates to limit the power flow of RF energy along the gallium arsenide millimeter-wave image waveguide and thereby protect any circuitry beyond the location of the PIN diode.

DESCRIPTION OF THE PREFERRED EMBODIMENTS

Figure 1:
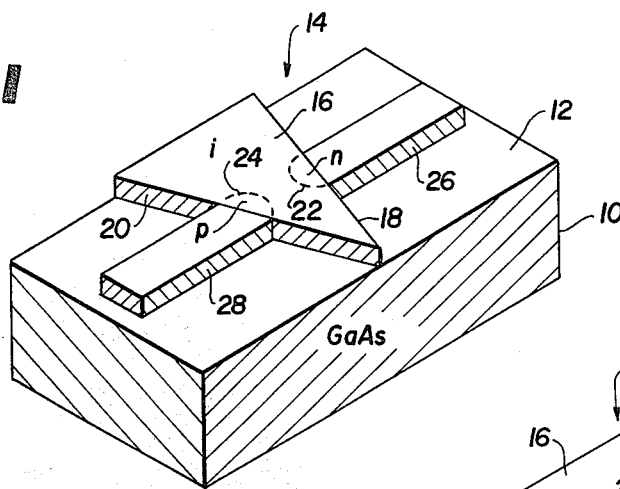
FIG. 1 is a perspective view of a first embodiment of the subject invention.

Referring now to the drawings and more particularly to FIG. 1, reference numeral 10 designates a dielectric image transmission line consisting of a waveguide structure comprised of a Group III-V compound, preferably gallium arsenide (GaAs). Although GaAs has a relatively high resistivity and is therefore semi-insulating, it nevertheless is adapted to propagate electromagnetic energy in the millimeter and sub-millimeter frequency region with relatively low loss and accordingly can be operated as a dielectric image line for RF power. On the upper surface 12 of the GaAs image waveguide 10 is formed a wedge-shaped semiconductor PIN diode having a planar configuration which uses the GaAs waveguide as a substrate. The PIN diode consists of a wedge-shaped region of intrinsic semiconductor material 16 into which is formed along the intersecting side edges 18 and 20 opposing recessed regions 22 and 24 of opposite semiconductivity type which are respectively heavily doped with n and p type dopant materials. Connected to the n and p regions 22 and 24 are a pair of planar beam leads 26 and 28 which extend outwardly from the PIN diode longitudinally along the substrate surface 12. The planar structure of the PIN diode 14 is formed from relatively thick epitaxial layers which are sequentially grown in the planar format shown using either chemical vapor deposition or molecular beam epitaxy, methods well known to those skilled in the art. Such a configuration permits its integration into other components such as the front end of an RF receiver, not shown.

Figure 2:
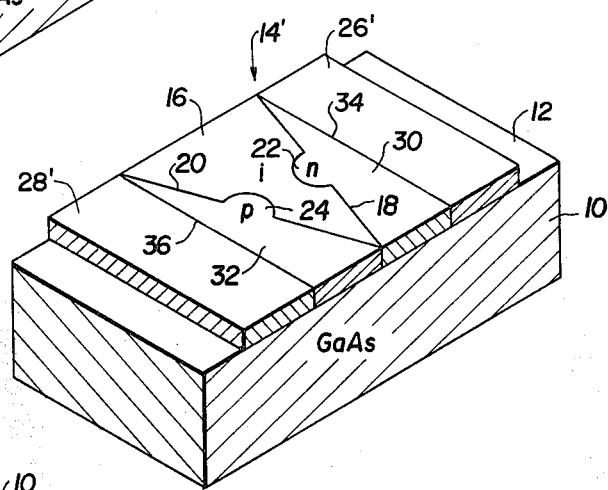
FIG. 2 is a perspective view of a second embodiment of the subject invention.

A modified form of the embodiment shown in FIG. 1 is disclosed in FIG. 2. There a planar PIN diode is formed on the surface 12 of the substrate 10 as before, however, the configuration shown in FIG. 2, in addition to the intrinsic region 16, now includes respective contiguous n type and p type semiconductive regions 30 and 32 which extend outwardly from the inwardly disposed or recessed n and p doped regions 22 and 24 along the side edges 18 and 20. Such a configuration in certain instances is easier to fabricate inasmuch as relatively wide contact surfaces 34 and 36 are provided for mating with adjoining beam leads 26' and 28' which are shown extending across the width of the upper surface 12 rather than lengthwise as shown in FIG. 1.

Figure 3:
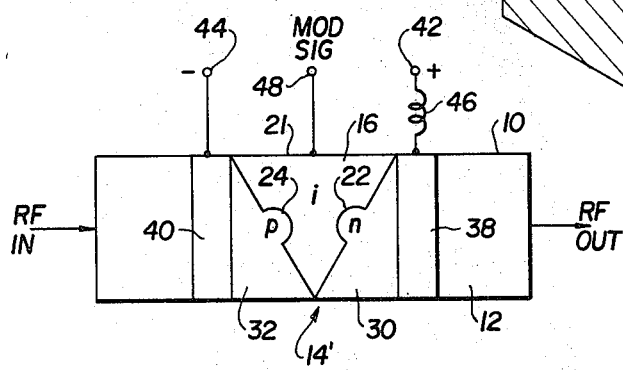
FIG. 3 is a top planar view partially in schematic form of the embodiment shown in FIG. 2 and being illustrative of its operating mode.
Figure 4:
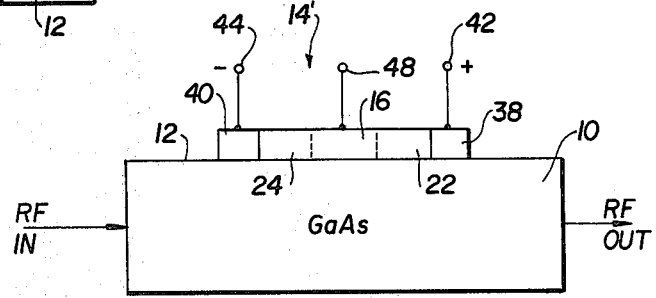
FIG. 4 is a side planar view partly in schematic form of the embodiment shown in FIG. 2 and being further illustrative of its operating mode.
Figure 5:
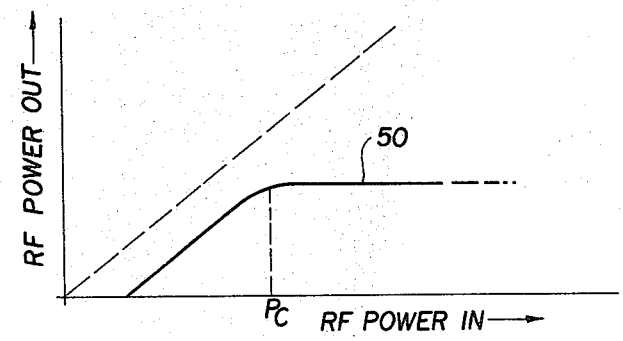
FIG. 5 is a graph helpful in understanding the operation of the subject invention.

In either case, the two opposing recessed n and p regions 22 and 24 are separated by intervening intrinsic material of region 16. In operation, as shown in FIGS. 3 and 4, a DC bias voltage is adapted to be applied across the PIN diode configuration 14' by means of voltage terminals 42 and 44 coupled to the beam leads 38 and 40, respectively, which act as ohmic contacts. Additionally, an inductance element 46 is included between the terminal 42 and the beam lead 38 for operating as an RF frequency choke. The application of the DC bias voltage across terminals 42 and 44 is adjusted so that a portion of the neutral impurities in the intrinsic region 16 between the n and p regions 22 and 24 are pre-ionized. The conductivity of the PIN diode is adapted to control the RF signal propagating along the GaAs image waveguide 10 in accordance with a control or modulating signal coupled to the intrinsic region 16 along the base edge 21 of the wedge 16 via terminal 48. The DC bias level and modulating signal is adapted to control the RF signal propagation through the GaAs guide 10 in the region of its acting as a substrate for the PIN diode 14' in the following manner. With reference to FIG. 5, curve portion 50 of the RF power in vs. RF power out characteristic shown indicates that above a critical power level Pc, the RF power output is limited to a predetermined value while at relatively low power levels, the RF power propagates through the dielectric waveguide with very little loss. At the limiting critical power level $P_c$, the energy imparted to the electrons and the holes of the PIN diode 14' is enough to create a net gain in energy causing an avalanche breakdown in the diode whose conductivity increases rapidly with a consequent decrease in dielectric constant whereupon RF energy propagating along the substrate waveguide 10 will be reflected back towards the source, not shown. Accordingly, the modulating or control signal applied to terminal 48 in conjunction with the bias voltage applied across terminals 42 and 44 is adapted to establish the critical power level $P_c$. When a switching action takes place, power limiting will occur and such action acts to protect any relatively sensitive components which would otherwise be damaged or otherwise rendered inoperative further along the RF transmission line.

Thus what has been shown and described is an RF millimeter wave power control switch in the form of a bulk effect beam lead planar PIN diode structure formed on a substrate of gallium arsenide which is the dielectric image transmission line for millimeter wave propagation.

While the invention has been particularly shown and described with reference to what is at present considered to be the preferred embodiments thereof, it is to be understood from the foregoing that this disclosure is made for purposes of explanation and not limitation and therefore other changes and modifications may be made without departing from the spirit and scope of the invention as set forth in the appended claims.

What is claimed is:

1. An RF power limiter for millimeter and sub millimeter waves, comprising:
   an image transmission line structure capable of propagating millimeter and sub-millimeter waves;
   a semiconductor PIN diode formed on one outer surface of said image transmission line structure, said image transmission line structure also being the substrate for said PIN diode;
   said PIN diode having a planar configuration consisting of a generally flat wedge-shaped region of intrinsic semiconductor material having adjoining edges including mutually opposing regions of oppositely doped semiconductor material separated by an intervening region of intrinsic material of said wedge-shaped region; and
   circuit means coupled to said intrinsic region and said oppositely doped regions for the application of operating potentials which cause a predetermined non-avalanche current to flow but achieving avalanche breakdown upon the propagation of a predetermined level of millimeter and sub-millimeter wave power along said image transmission line structure causing a portion of the propagating energy to be reflected in the opposite direction to propagation and thereby provide a limiting action.

2. The RF power limiter as defined by claim 1 wherein said image transmission line comprises a dielectric image transmission line.

3. The RF power limiter as defined by claim 2 wherein said dielectric image transmission line comprises a waveguide structure formed from a Group III-V compound.

4. The RF power limiter as defined by claim 3 wherein said compound comprises gallium arsenide.

5. The power limiter as defined by claim 2 wherein said circuit means includes a pair of planar ohmic contact regions respectively connected to said opposing regions of oppositely doped semiconductor material.

6. The power limiter as defined by claim 5 wherein said ohmic contact regions are adapted to receive a DC bias potential and wherein said circuit means additionally includes means for applying a control potential to said wedge-shaped region of intrinsic semiconductor material in the region of the base edge thereof terminating at said adjoining edges.

7. The RF power limiter as defined by claim 5 wherein said ohmic contact regions are comprised of planar beam lead type contact regions.

8. The RF power limiter as defined by claim 2 wherein said mutually opposing regions of oppositely doped semiconductor material extend from the respective edges into said wedge-shaped intrinsic region.

9. The RF power limiter as defined by claim 2 wherein said mutually opposing regions of oppositely doped semiconductor material extend outwardly from and along the respective edges of said adjoining edges of said intrinsic region.

10. The power limiter as defined by claim 2 wherein said flat wedge-shaped region of intrinsic semiconductor material is of a predetermined substantially uniform thickness and wherein said regions of oppositely doped semiconductor material are of the same substantially uniform thickness as said intrinsic region.

11. The power limiter as defined by claim 5 wherein said wedge-shaped region of intrinsic material extends transversely across a lengthwise outer surface of said gallium arsenide waveguide structure including multiple outer surfaces and having an apex and an opposite elongated base edge lying proximate to respective outer side surfaces meeting said lengthwise surface.

12. The diode structure as defined by claim 11 wherein said adjoining edges including the mutually opposing regions of oppositely doped semiconductor material comprise diagonal edges running transverse to the longitudinal direction of the lengthwise outer surface of waveguide structure and wherein said mutually opposing regions of oppositely doped semiconductor material are located substantially midway across said lengthwise outer surface.

13. The power limiter as defined by claim 2 wherein said opposing regions of oppositely doped semiconductor material are comprised of n and p type semiconductor material.

* * * * *